(12) United States Patent
Haeuser et al.

(10) Patent No.: US 6,960,915 B2
(45) Date of Patent: Nov. 1, 2005

(54) ELECTRIC CIRCUIT SYSTEM

(75) Inventors: Thomas Haeuser, Moeglingen (DE); Johannes Hesselbarth, Moeglingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/273,788

(22) Filed: Oct. 17, 2002

(65) Prior Publication Data

US 2003/0098705 A1  May 29, 2003

(30) Foreign Application Priority Data

Oct. 20, 2001  (DE) ................. 101 52 256

(51) Int. Cl.⁷ .................. H01H 31/12; G01R 31/26
(52) U.S. Cl. ................ 324/500; 324/551; 324/765
(58) Field of Search .................... 324/500, 158.1, 324/765, 551

(56) References Cited

U.S. PATENT DOCUMENTS

| 5,241,221 A | * | 8/1993 | Fletcher et al. | 327/170 |
| 5,355,038 A | * | 10/1994 | Hui | 327/277 |
| 5,640,095 A | | 6/1997 | Beier et al. | 324/522 |
| 5,929,680 A | | 7/1999 | Lim | 327/264 |
| 5,955,890 A | * | 9/1999 | Gillette | 326/30 |
| 6,275,023 B1 | * | 8/2001 | Oosaki et al. | 324/158.1 |

FOREIGN PATENT DOCUMENTS

| DE | 196 11 522 | 9/1997 |
| DE | 197 21 366 | 11/1998 |
| EP | 0 451 595 | 10/1991 |
| EP | 1 308 734 | 5/2003 |

OTHER PUBLICATIONS

R. J. Baker. H. W. LI, D.E. Boyce: "CMOS Design, Layout and Simulation", IEEE Press, Piscataway, NJ 08855-1331 XP002280706, p. 201—p. 230, Pictures 11.5, 11.6, 11.8, 11.24, Example 11.3, no date.
European Search Report, May 27, 2004, EPO 2017194.

* cited by examiner

Primary Examiner—Anjan Deb
Assistant Examiner—John Teresinski
(74) Attorney, Agent, or Firm—Kenyon & Kenyon

(57) ABSTRACT

An electric circuit system for detecting a short circuit between output PINs of different ICs, particularly CMOS-ICs, which in each case have a first switching element, particularly a highside transistor and a second switching element, particularly a lowside transistor as output driver, the first switching element and the second switching element of the respective output drivers having different source-drain resistances in the switched-on state.

13 Claims, 2 Drawing Sheets

ELECTRIC CIRCUIT SYSTEM

FIELD OF THE INVENTION

The present invention relates to an electric circuit system which is configured to detect a short circuit between pins of adjacent output drivers of a CMOS-IC.

BACKGROUND INFORMATION

German Published Patent Application No. 197 21 366 relates to an electric circuit system for checking a series connection, made of a switch and a load, having a first circuit which is connected to a connection point between the switch and the load and which is suitable for detecting a first state, the first state representing a short circuit of the connection point to the supply voltage. This circuit system provides a second circuit which is parallel-connected to the first circuit wherein the second circuit is connected to the connection point and is suitable for detecting a second or a third state, the second state representing a short circuit of the connection point to ground, and the third state representing an interruption of the connection point to the supply voltage.

Safety-related systems in motor vehicles, for example, must not lead to a safety-critical state, even in an event of a fault. A so-called FMEA analysis (failure mode and effects analysis) is usually carried out in conjunction with such identifications. Typically, low levels of the system are described within the scope of a FMEA analysis. They may be individual components or low-level configurations. For each such low level, a list of possible faulty operating modes is generated, effects of the possible faulty operating modes subsequently being determined.

For electronic control devices, short circuits between two adjacent output PINs of an integrated circuit, in the following referred to as IC, are considered among other things within the scope of an FMEA analysis.

Typical difficulties within the framework of a FMEA analysis are, for example, that short circuits between adjacent PINs, (i.e. output PINs of output drivers) must not lead to a safety-critical switch-off path becoming inoperative. Furthermore, by readback of a critical output signal, it must be able to be ensured that a fault in the signal transmission between two ICs is detected.

In the case of customary output drivers of CMOS-ICs, the transistor on the supply-voltage side, hereinafter designated as a highside transistor, and the ground-side transistor, hereinafter designated as a lowside transistor, have the same drain-source resistance $R_{DSon}$ when the transistor (MOSFET) is switched on. The result is that in response to a short circuit between two PINs of adjacent output drivers, an undefined state may result if one of the outputs is switched to logic H, and the other is switched to logic L.

SUMMARY

The object of the present invention is to provide a circuit system in which a short circuit between the PINs of adjacent output drivers of a CMOS-IC may be determined in the simplest manner possible.

According to the present invention, PIN-to-PIN short circuits may be intercepted with little expenditure by the different dimensioning of respective switching elements, since the same valid logic level reproducibly ensues with all conceivable conditions with respect to patterns, temperatures and tolerances. The present invention has the distinction that, compared to conventional ICs, particularly CMOS-ICs, the invention requires no additional components. The detection of a short circuit between two PINs according to the present invention may also be achieved using an open-drain PIN driver. However, such PIN drivers have the feature that a pull-up resistor is needed as an additional external component. In addition, the power loss rises, since in the case of an L-level, a current permanently flows through the pull-up resistor.

According to one exemplary embodiment of the circuit system of the present invention, the at least one IC is configured as a CMOS-IC which has a highside transistor and a lowside transistor as output driver, the highside transistor and the lowside transistor exhibiting different source-drain resistances in the switched-on state. Such components may be made available, and prove to be robust and reliable in practical use.

The drain-source resistors of the lowside transistors may be smaller than the drain-source resistors of the highside transistors. Due to this dimensioning, the L-level is adjustable as the dominant level, which corresponds to the switched-off, and thus generally less critical state of a function. The lowside transistors may be configured as N-channel MOSFETs, since they may be implemented more easily with lower $R_{DSon}$ than as P-channel MOSFETs.

DETAILED DESCRIPTION

Figure 1:
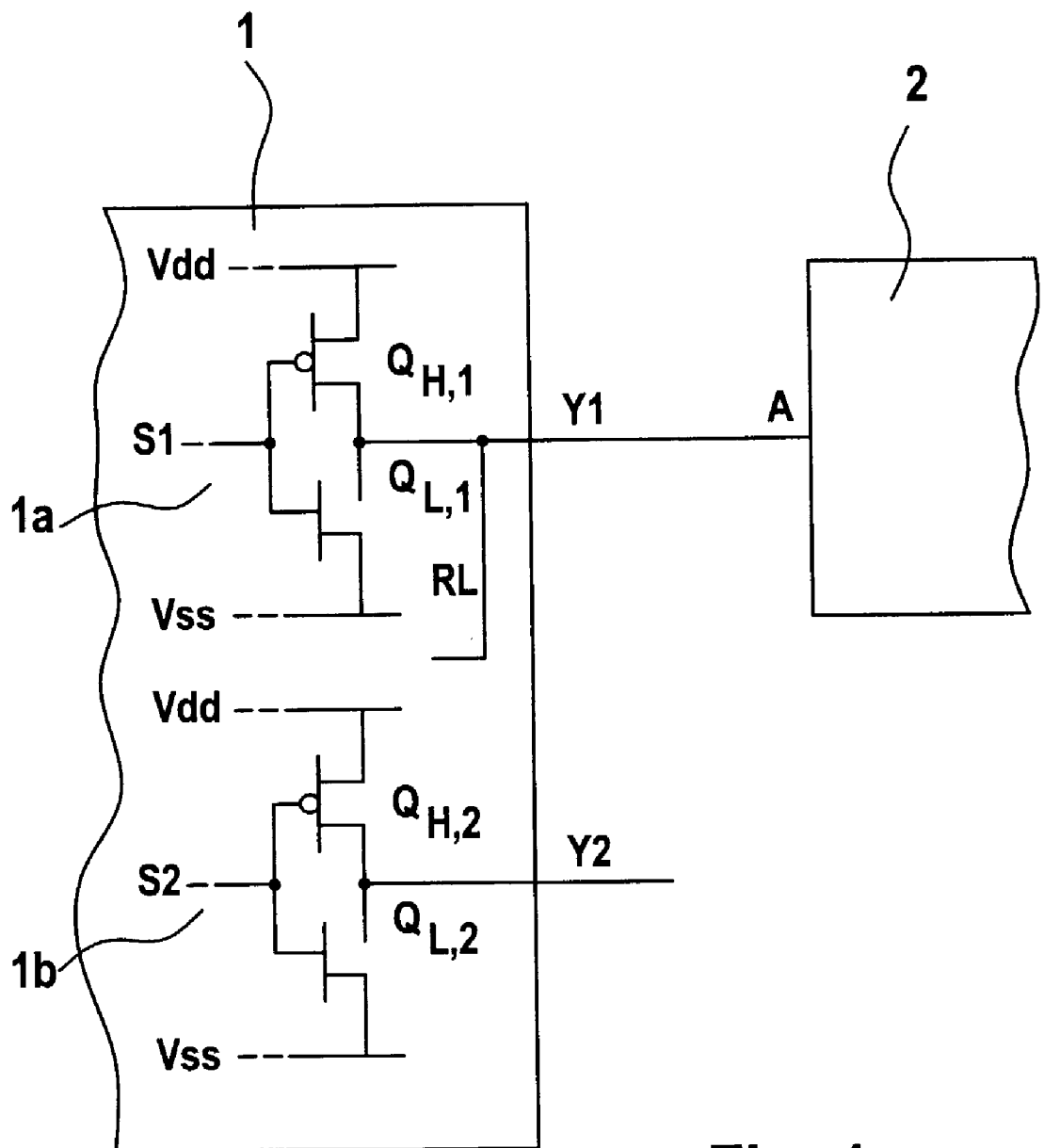
FIG. 1 is a schematically simplified representation of an exemplary embodiment of a circuit system according to the present invention.

In FIG. 1, a first IC is designated by reference number 1, and a second IC is designated by reference number 2. First IC 1 has two output drivers 1a, 1b. Output drivers 1a, 1b are implemented using CMOS technology, and have in each case a highside transistor $Q_{H,1}$ and $Q_{H,2}$, respectively, and a lowside transistor $Q_{L,1}$ and $Q_{L,2}$, respectively.

The input signals of output drivers 1a, 1b are designated as $S_1$ and $S_2$, respectively; their output signals are denoted by $Y_1$ and $Y_2$, respectively. The output signal $Y_1$ of the first output driver is transmitted as an input signal A to the second IC. A readback path RL is also provided, by which it must be ensured that a fault in the signal transmission from $Y_1$ to A is detected. The supply-voltage levels to which the circuit system is connected are denoted by Vdd and Vss, respectively. For the sake of simplicity, in the following, voltage level Vdd is denoted as supply voltage, and voltage level Vss is denoted as ground. If a short circuit occurs between the two output PINs of the output drivers, i.e. between the lines carrying output signals $Y_1$ and $Y_2$, usually an undefined state results, for example, when one of the outputs was switched to logic H, and the other was switched to logic L. This is because the highside transistors and the lowside transistors of respective output drivers 1a, 1b are conventionally configured with the same drain-source resistance $R_{DSon}$. If, for example, in the example illustrated, output $Y_1$ is at logic H, and output $Y_2$ is at logic L, then an output level ensues which is given essentially by the voltage divider of the drain-source resistors of $Q_{H,1}$ and $Q_{L,2}$. This level typically lies in the undefined range between the H-level and the L-level, but depending on production tolerances, temperatures, etc., may also correspond to a valid H or L level. The value read from connected input A of second IC 2 is therefore undefined.

In the exemplary embodiment illustrated, difficulties are encountered during a short circuit between $Y_1$ and $Y_2$, and switch-off path A functions only in a portion of the patterns. Therefore, analyses on one pattern cannot be transferred to other patterns or samples.

A fault because of a short circuit between $Y_1$ and $Y_2$ cannot be reliably detected by readback of signal $Y_1$ into IC 1 (via readback path RL), since the level may lie in the undefined range. Given a level in the undefined range, the read-back logic value and the logic value read in from input A may assume different values.

Provision is now made according to the present invention to configure one of the transistors of each output driver, as an example lowside transistor $Q_{L,1}$ and $Q_{L,2}$, respectively, to be suitably stronger, i.e. with smaller drain-source resistance $R_{DSon}$. This transistor is dimensioned (i.e. the respective highside and lowside transistors are adjusted in such a way to one another) such that, in the event of a short circuit between two PINs having different output level, an L-level ensues in a defined manner. When working with more complex output circuits, the effective resistances of the transistors are to be configured accordingly.

With the provision of this measure, PIN-PIN short circuits may be intercepted with little expenditure, since the same valid logic level appears reproducibly for all patterns, temperatures and tolerances. Moreover, the L-level set in the example illustrated corresponds to the switched-off, and thus generally less critical state of a function of a control device.

Figure 2:
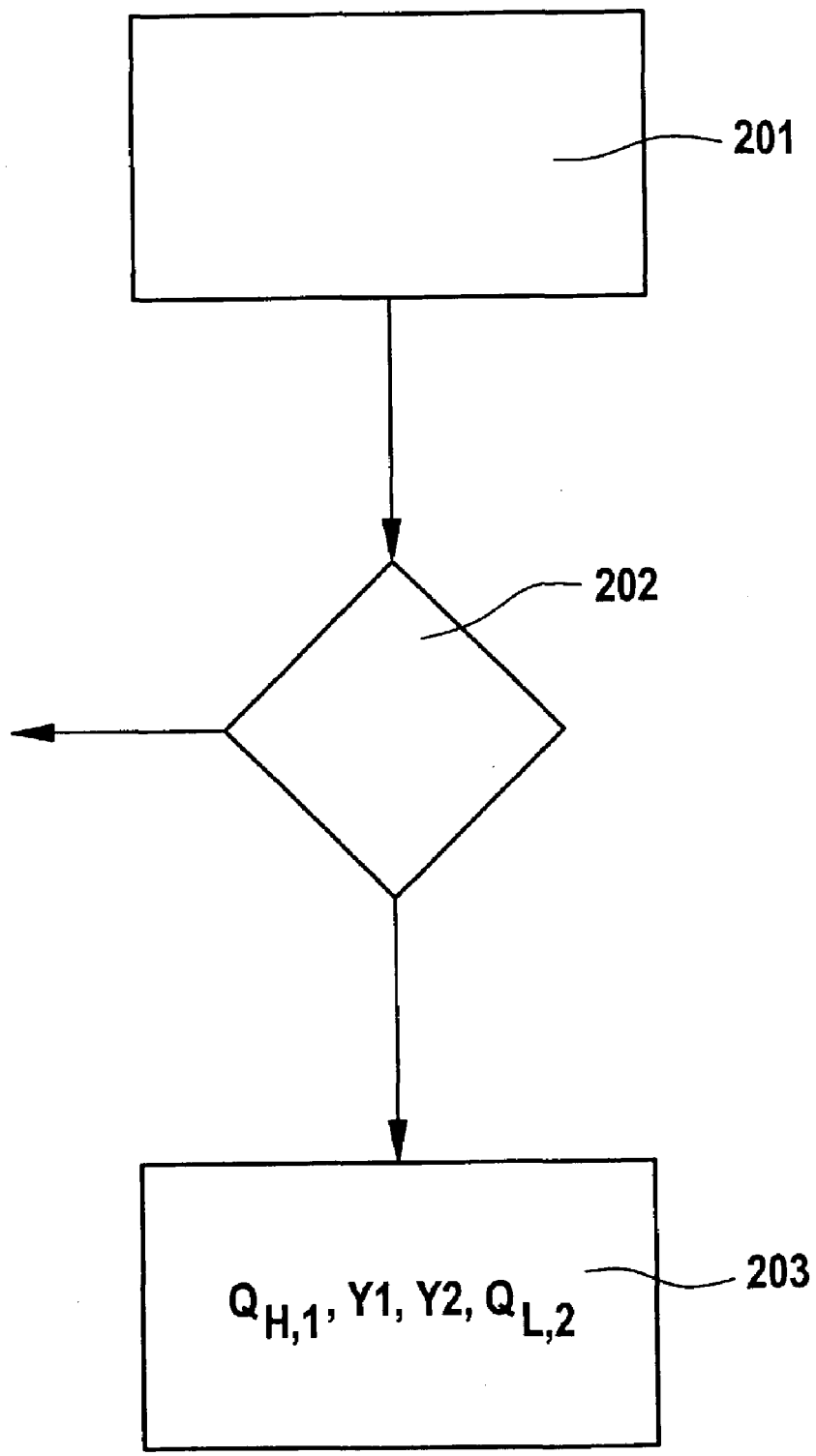
FIG. 2 is a diagram for clarifying an example embodiment of the invention in light of a specific circuit state.

The design approach of the present invention shall now be further explained with reference to FIG. 2 on the basis of a specific circuit state: it being assumed that output signal $Y_1$ of first output driver 1a is at H-level, and output signal $Y_2$ of second output driver 1b is at L-level (starting situation 201). For the transistors of the first output driver, highside transistor $Q_{H,1}$ is switched on, and lowside transistor $Q_{L,1}$ is blocked or closed. In second output driver 1b, highside transistor $Q_{H,2}$ is blocked, while lowside transistor $Q_{L,2}$ is switched on. In the event of a short circuit (event 202), a current from $Q_{H,1}$ via $Y_1$ via $Y_2$ via $Q_{L,2}$ to ground (Vss) results (state 203). By appropriately smaller dimensioning the drain-source resistance $R_{DSon}$ of transistor $Q_{L,2}$ relative to the drain-source resistance of transistor $Q_{H,1}$, the resulting voltage level may be pushed into the vicinity of ground, i.e., of voltage level Vss.

This state is detectable as faulty, since signal levels $Y_1$ and A via readback path RL may be recognized as deviating from one another. Given a short circuit between $Y_1$ and $Y_2$, the function of the switch-off path to A is ensured without additional measures, if the L-level corresponds to the switched-off state of IC2. Furthermore, given a short circuit between $Y_1$ and $Y_2$, a valid level always sets in, so that readback path RL and input A read in the same logic level. The short circuit may be reliably recognized by readback of $Y_1$, if $Y_1$ and $Y_2$ are driven with a different logic level.

What is claimed is:

1. An electric circuit system for detecting a short circuit between output PINs of at least one IC, comprising:
   a first switching element; and
   a second switching element, the first switching element and the second switching element configured as an output driver,
   wherein the first switching element and the second switching element of the output driver have different resistances in a switched-on state, and
   wherein the at least one IC has a highside transistor and a lowside transistor as the output driver, the highside transistor and the lowside transistor having different source-drain resistances in the switched-on state, so that the low side transistor and the high side transistor have a different dimensioning, wherein a fixed asymmetric impedance ratio of output impedance provides an asymmetric output to detect failures.

2. The circuit system according to claim 1, wherein the at least one IC is configured as a CMOS-IC which has a highside transistor and a lowside transistor as the output driver, the highside transistor and the lowside transistor having different source-drain resistances in the switched-on state.

3. The circuit system according to claim 2, wherein in the output driver, the second switching element is dimensioned smaller than the first switching element.

4. The circuit system according to claim 3, wherein the output driver is configured with a readback path.

5. The circuit system according to claim 4, wherein the readback path is arranged to detect a fault of a signal transmission from the output driver to a second IC.

6. The circuit system according to claim 3, wherein the second switching element is configured as a N-channel MOSFET.

7. The circuit system according to claim 2, wherein the output driver is configured with a readback path.

8. The circuit system according to claim 7, wherein the readback path is arranged to detect a fault of a signal transmission from the output driver to a second IC.

9. The circuit system according to claim 2, wherein the second switching element is configured as a N-channel MOSFET.

10. The circuit system according to claim 1, wherein in the output driver, the second switching element is dimensioned smaller than the first switching element.

11. The circuit system according to claim 1, wherein the output driver is configured with a readback path.

12. The circuit system according to claim 11, wherein the readback path is arranged to detect a fault of a signal transmission from the output driver to a second IC.

13. The circuit system according to claim 1, wherein the second switching element is configured as a N-channel MOSFET.

* * * * *

UNITED STATES PATENT AND TRADEMARK OFFICE
CERTIFICATE OF CORRECTION

| | | |
|---|---|---|
| PATENT NO. | : 6,960,915 B2 | Page 1 of 1 |
| APPLICATION NO. | : 10/273788 | |
| DATED | : November 1, 2005 | |
| INVENTOR(S) | : Thomas Haeuser et al. | |

It is certified that error appears in the above-identified patent and that said Letters Patent is hereby corrected as shown below:

Drawing Sheet 2, in Element 201 insert label --Starting Situation--

Drawing Sheet 2, in Element 202 insert label --Event--

Signed and Sealed this

Twenty-fourth Day of April, 2007

JON W. DUDAS
*Director of the United States Patent and Trademark Office*